US007338881B2

United States Patent
Sakata et al.

(10) Patent No.: US 7,338,881 B2
(45) Date of Patent: Mar. 4, 2008

(54) METHOD FOR MANUFACTURING SEMICONDUCTOR ELEMENT

(75) Inventors: Toyokazu Sakata, Tokyo (JP); Kousuke Hara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 193 days.

(21) Appl. No.: 11/239,145

(22) Filed: Sep. 30, 2005

(65) Prior Publication Data

US 2006/0105540 A1 May 18, 2006

(30) Foreign Application Priority Data

Nov. 17, 2004 (JP) .............................. 2004/332695

(51) Int. Cl.
*H01L 21/76* (2006.01)
(52) U.S. Cl. ...................... 438/442; 438/297; 438/439
(58) Field of Classification Search ................ 438/297, 438/439, 442
See application file for complete search history.

(56) References Cited

FOREIGN PATENT DOCUMENTS

JP        2002-237603        8/2002

*Primary Examiner*—Carl Whitehead, Jr.
*Assistant Examiner*—Sonya D. McCall-Shepard
(74) *Attorney, Agent, or Firm*—Volentine & Whitt, P.L.L.C.

(57) ABSTRACT

A method for manufacturing a semiconductor element includes preparing an SOI layer having a transistor forming area and an element isolation area, forming an oxidation-resistant mask layer on the SOI layer, forming a resist mask over the transistor forming area on the oxidation-resistant mask layer, a first etching that etches the oxidation-resistant mask layer using the resist mask so that a predetermined thickness of the oxidation-resistant mask layer remains, a second etching that etches the remaining oxidation-resistant mask layer, using the resist mask and exposing the SOI layer at the element isolation area, and oxidizing the exposed SOI layer using the remaining oxidation-resistant mask layer, to form an element isolation layer. An etching rate during the first etching is higher than during the second etching and a silicon-to-etching selection ratio during the second etching is higher than during the first etching.

10 Claims, 3 Drawing Sheets

GRAPH SHOWING DISTRIBUTIONS OF THICKNESS OF SILICON NITRIDE FILM AND ETCHING RATES EMPLOYED IN EMBODIMENT

EXPLANATORY VIEW SHOWING MANUFACTURING PROCESS OF ELEMENT ISOLATION LAYER ACCORDING TO EMBODIMENT

GRAPH SHOWING DISTRIBUTIONS OF THICKNESS OF SILICON NITRIDE FILM AND ETCHING RATES EMPLOYED IN EMBODIMENT

METHOD FOR MANUFACTURING SEMICONDUCTOR ELEMENT

BACKGROUND OF THE INVENTION

The present invention relates to a method for manufacturing semiconductor elements each configured in such a manner that an element isolation layer is formed in an SOI layer of an SOI (Silicon On Insulator) substrate by a LOCOS (Local Oxidation of Silicon) method.

An SOI type semiconductor device is formed on an SOI substrate in which a support substrate, an insulating layer (buried oxide film) and a silicon thin film layer (called "SOI layer") made of monocrystalline silicon are sequentially formed. It is known that owing to an SOI structure, complete separation between elements becomes easy and a soft error and latch-up can be suppressed. Since the junction capacitance of a source/drain region can be reduced, such a technique has been used in the manufacture of many semiconductor devices as a technique that makes a contribution to speeding up and a reduction in power consumption.

Semiconductor elements have been micro-fabricated corresponding to densification of each of recent semiconductor devices. An SOI substrate in which the thickness of an SOI layer for forming each semiconductor element is set to 50 nm (nanometers) or less, has been mainstream.

On the other hand, a LOCOS method is known as one method for forming an element isolation layer on a normal silicon semiconductor substrate to insulate and isolate between semiconductor elements. This has been utilized as a method for forming an element isolation layer in an SOI layer relatively thick in thickness.

When the element isolation area is formed in the SOI layer relatively thick in thickness, a silicon nitride film is formed over the SOI layer through a pad oxide film interposed therebetween prior to the formation of the element isolation area. These are anisotropically etched to expose the SOI layer comprised of silicon. The exposed silicon is dry-oxidized by the LOCOS method to generate and form an insulating film comprised of silicon dioxide ($SiO_2$).

On the other hand, there is known, as a method for performing etching on a thin-film SOI layer, an example wherein when sidewall spacers comprised of silicon dioxide are formed on their corresponding sidewalls of a gate electrode of a MOS element, a silicon dioxide film formed on the upper surface of the gate electrode is etched by 70 to 90% of its thickness and thereafter the remaining silicon dioxide is removed by plasma etching high in silicon selection ratio to thereby remove the silicon dioxide film on the upper surface of the gate electrode, whereby tail shaping due to the deposition of a superimposed film at the sidewalls of the gate electrode is prevented (refer to, for example, a patent document 1 (Japanese Patent Laid-Open No. 2002-237603 (paragraphs 0031-00036 in the fifth page, and FIG. 6)).

However, there is a risk that when the SOI layer is thinned up to 50 nm or less for the purpose of miniaturization of the semiconductor device, even the SOI layer is removed when the silicon nitride film (oxidation-resistant mask layer) laminated prior to the formation of the element isolation layer is anisotropically etched. When the SOI layer is removed without remaining, for instance, the formation of the insulating film by silicon dioxide using the LOCOS method becomes difficult, and the insulation/separation between semiconductor elements becomes incomplete, so that a short circuit occurs between the adjacent semiconductor elements, thus causing a problem that the reliability of the semiconductor device is degraded.

SUMMARY OF THE INVENTION

The present invention has been made to solve the foregoing problems. It is therefore an object of the present invention to provide means which allows an SOI layer for forming an element isolation layer to remain upon etching of an oxidation-resistant mask layer laminated on the surface of the SOI layer, and forms the stable element isolation layer by a LOCOS method.

///According to one aspect of the present invention, for attaining the above object, there is provided a method for manufacturing a semiconductor element comprised of an SOI structure including an SOI layer, comprising the steps of preparing the SOI layer having a transistor forming area and an element isolation area on a surface thereof, forming an oxidation-resistant mask layer on the surface of the SOI layer, forming a resist mask in an area corresponding to the trnasistor forming area on the oxidation-resistant mask layer, a first etching step for etching the oxidation-resistant mask layer using the resist mask in such a manner that the oxidation-resistant mask layer remains by a predetermined thickness, a second etching step for etching the oxidation-resistant mask layer allowed to remain by the predetermined thickness in accordance with the first etching step and exposing the SOI layer of a portion corresponding to the element isolation area, and oxidizing the exposed SOI layer by a LOCOS method using the oxidation-resistant mask layer allowed to remain in accordance with the second etching step to thereby form an element isolation layer, wherein an etching rate of the oxidation-resistant mask layer in the first etching step is higher than that of the oxidation-resistant mask layer in the second etching step, and wherein a silicon/etching selection ratio in the second etching step is higher than a silicon-to-etching selection ratio in the first etching step.

Thus, the present invention obtains advantageous effects in that since the remaining oxidation-resistant mask layer is etched under a condition in which a silicon-to-etching selection ratio is high, a silicon layer necessary for oxidation can be allowed to remain, and an element isolation layer can stably be formed by a LOCOS method even in the case of a relatively thin SOI layer.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENT

Preferred embodiments of a method for manufacturing a semiconductor element according to the present invention will hereinafter be described with reference to the accompanying drawings.

Figure 1:
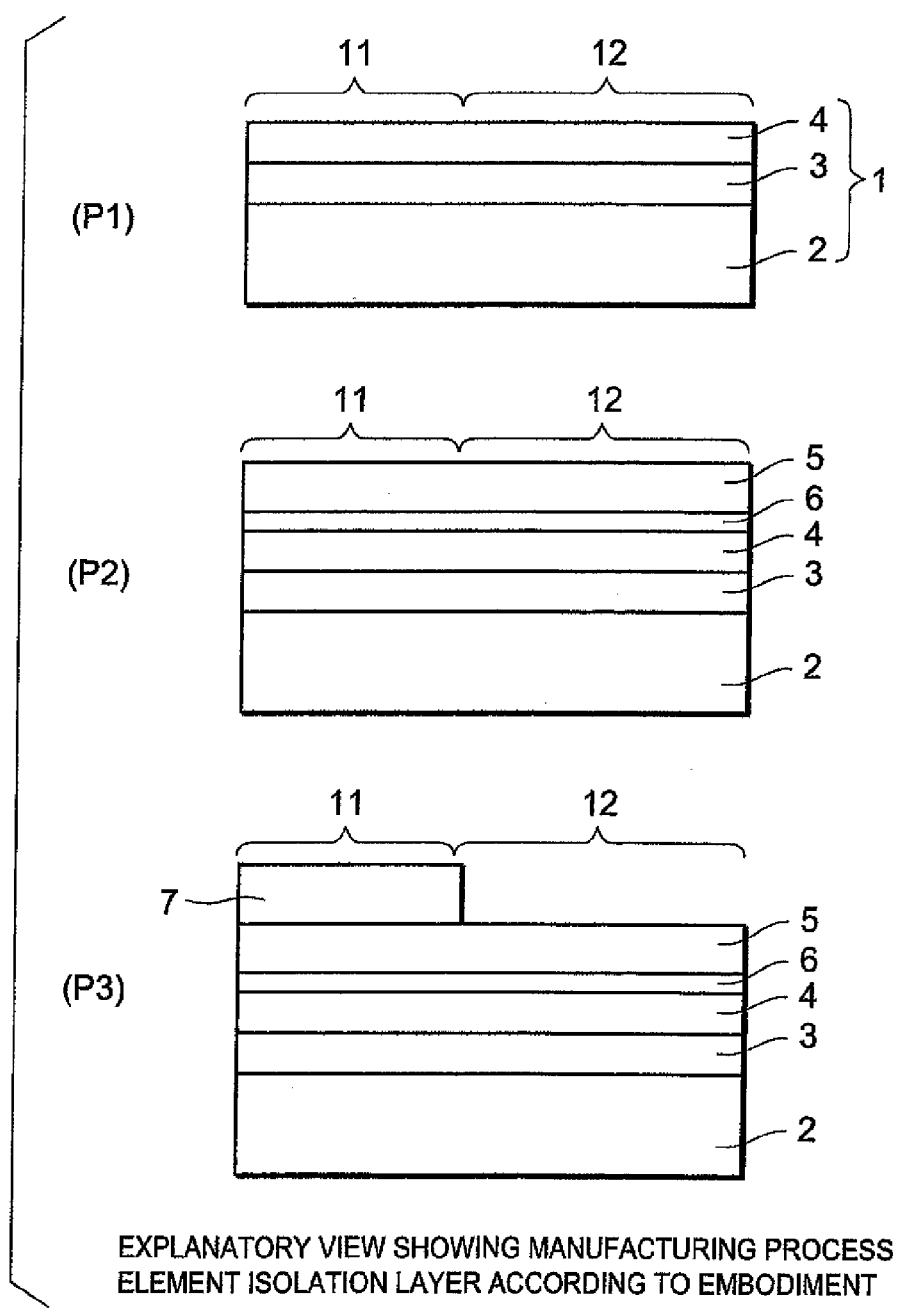
FIG. 1 is an explanatory view showing a manufacturing process of an element isolation layer employed in an embodiment.
Figure 2:
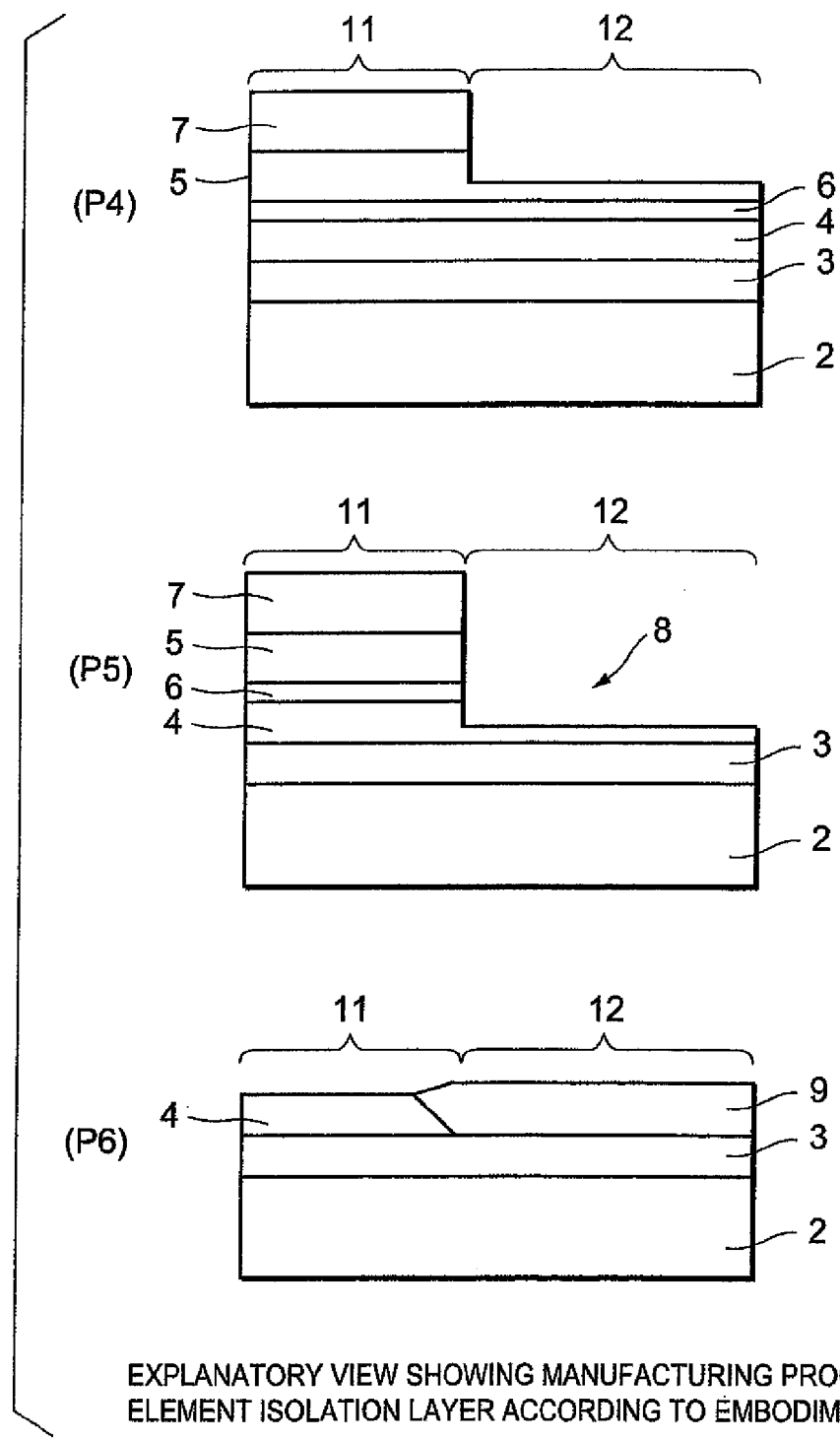
FIG. 2 is an explanatory view illustrating a manufacturing process of an element isolation layer employed in an embodiment.

FIGS. 1 and 2 are explanatory views each showing a manufacturing process of an element isolation layer employed in an embodiment.

In FIG. 1, reference numeral 1 indicates an SOI substrate, which is formed by laminating a support substrate 2 constituted of silicon or the like, an insulating layer 3 formed on the support substrate 2, which is made up of silicon dioxide, and an SOI layer 4 comprised of thin monocrystalline silicon on one another.

Reference numeral 5 indicates a silicon nitride film formed as an oxidation-resistant mask layer, which is formed on a pad oxide film 6 corresponding to a thin silicon dioxide film by a CVD method (Chemical Vapor Deposition) method, which pad oxide film is formed on the SOI substrate 4 by a thermal oxidation method. The silicon nitride film 5 functions as a mask used when each of element isolation layers 9 to be described later is formed by a LOCOS method.

Incidentally, one typical role of the pad oxide film 6 is to relax stress produced due to the difference between lattice constants of crystal structures of the silicon nitride film 5 and the SOI layer 4 corresponding to the monocrystalline silicon.

Reference numeral 7 indicates a resist which is formed on the silicon nitride film 5 by its application. The resist 7 is of a mask material which covers areas (called "transistor forming areas 11") each used to form a semiconductor element on the surface of the SOI layer 4 upon etching processing.

Reference numeral 8 indicates a removal portion which is a portion etched by anisotropic etching.

Reference numerals 9 indicate the element isolation layers, each of which is an insulating film made up of silicon dioxide, formed in an element isolation area 12 on the surface of the SOI layer 4 by dry-oxidizing silicon by use of the LOCOS method. The element isolation layers 9 respectively insulate and separate among the transistor forming areas 11 of the SOI layer 4.

The method for manufacturing the semiconductor element, according to the present embodiment will be explained below in accordance with process steps indicated by P using FIG. 1.

In P1 (see FIG. 1), an SOI substrate 1 comprising a support substrate 2, an insulating layer 3 and an SOI layer 4 having a transistor forming area 11 and an element isolation area 12 on its surface all of which have been fabricated in advance, is prepared.

In P2 (see FIG. 1), a pad oxide film 6 is formed on the SOI layer 4 of the prepared SOI substrate 1 by the thermal oxidation method. Then, a silicon nitride film 5 is formed on the pad oxide film 6 by the CVD method. The thickness of the pad oxide film 6 is 70 angstroms, for example, and the thickness of the silicon nitride film 5 is 1000 angstroms, for example.

In P3 (see FIG. 1), a resist 7 is applied onto the silicon nitride film 5 and patterned using ultraviolet rays or the like, whereby a resist mask is formed so as to mask each transistor forming area 11 of the SOI layer 4.

In P4 (see FIG. 2), anisotropic etching placed under the following first condition (silicon nitride film etching rate: 2080 angstroms/min, silicon etching rate: 156 angstroms/min, and a silicon-to-etching selection ratio (called "ratio between etching rates of an etched film (silicon nitride film) and a silicon film): about 13) is performed by an etching device, e.g., a die balling type magnetron RIE (Reactive Ion Etching) device using the resist mask formed in an area corresponding to the transistor forming area 11, whereby the silicon nitride film 5 is etched with being left behind by a predetermined thickness (first etching step).

The first condition:
Used gas: $CHF_3/Ar/O_2$=30/150/2 (sccm)
Pressure: 40 mTorr
RF (Radio Frequency) power: 300 W
Heating temperature of lower electrode: 40° C.

The silicon nitride film 5 may be etched in such a manner that a predetermined thickness of the silicon nitride film 5 allowed to remain in the first etching step ranges from over 10% of the thickness of the silicon nitride film 5 formed in the process step of P2 to under 30% thereof, preferably, it reaches 10%.

Figure 3:
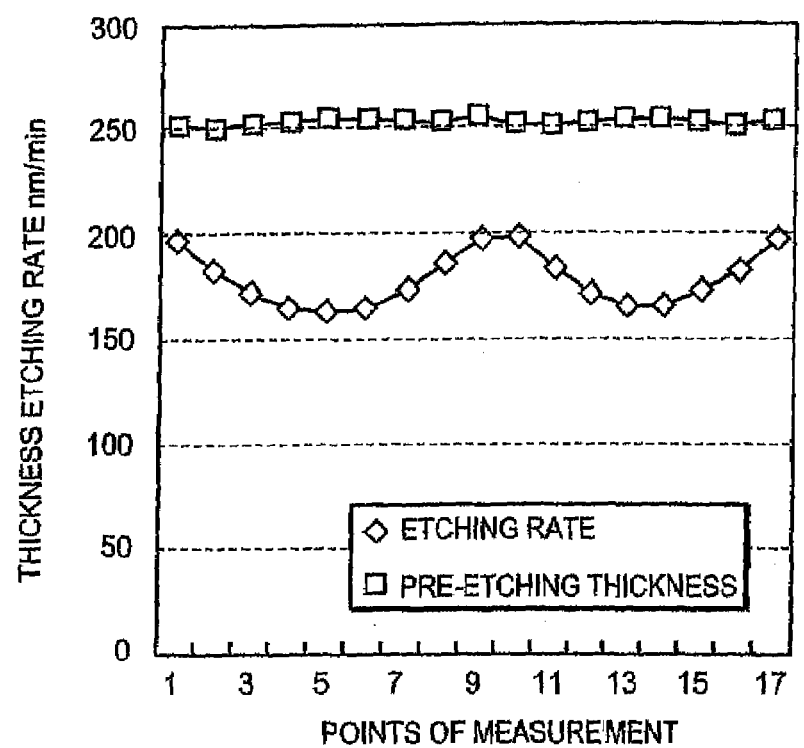
FIG. 3 is a graph showing distributions of the thicknesses of a silicon nitride film and etching rates employed in each of the embodiments.

That is, according to the result of measurements of distributions of the thicknesses (called "pre-etching thicknesses") of the silicon nitride film 5 formed by the CVD method in the process step of P2, which are indicated by marks □ in FIG. 3, and silicon nitride film etching rates (shown as etching rates in FIG. 3) under the first condition, which are expressed in marks ◇ in FIG. 3 used as indices for etching errors of the etching device, the uniformity ((maximum thickness−minimum thickness)/(maximum thickness+minimum thickness)) of the etching thickness and the uniformity ((maximum etching rate−minimum etching rate)/(maximum etching rate+minimum etching rate)) of etching rates of the silicon nitride film are about 1% and about 9% respectively.

Therefore, in order to allow the silicon nitride film 5 to remain upon etching under the first condition, 10% obtained by adding together an error at the formation of the silicon nitride film 5 and an etching error of the etching device may preferably be set to the thickness of the silicon nitride film 5 allowed to remain after the etching. It is desirable that the thickness of the silicon nitride film 5 allowed to remain is set to less than or equal to 30% in order to shorten the time required to form the removal portion 8.

Incidentally, since the thickness of the pad oxide film 6 is much thinner than that of the silicon nitride film 5, there is no need to take into consideration the thickness of the pad oxide film 6 upon an examination of the thickness of the silicon nitride film 5.

Next, in P5 (see FIG. 2), anisotropic etching based on the following second condition (silicon nitride film etching rate: 1520 angstroms/min, silicon etching rate: 34 angstroms/min, and a silicon-to-etching selection ratio: about 45) higher in silicon-to-etching selection ratio than the first condition is done using the resist mask formed in the area corresponding to the transistor forming area 11 as it is, whereby the remaining silicon nitride film 5 and pad oxide film 6 are etched to expose the SOI layer 4, followed by formation of a removal portion 8 (second etching step).

The second condition:
Used gas: $CHF_3/CO/CH_2F_2$=15/170/15 (sccm)
Pressure: 25 mTorr
RF power: 800 W It is desirable to allow the SOI layer 4 to remain as much as possible without cutting it away while the surface of the SOI layer 4 is being exposed, in the second etching step. According to the second etching step high in silicon selection ratio, however, the amount of etching of silicon can be suppressed to the minimum, and the silicon layer, i.e., the SOI layer 4 can be allowed to remain on the insulating layer 3 by a thickness (ranging from approximately 10 to 20 nm, for example) necessary for subsequent LOCOS oxidation upon completion of the second etching step.

In P6 (see FIG. 2), the resist 7 is removed after completion of the second etching step. The SOI layer 4 (silicon) allowed to remain on the insulating layer 3, and a portion adjacent to the SOI layer 4 below the silicon nitride film 5 are dry-oxidized by the LOCOS method with the silicon nitride film 5 as a mask to produce an insulating film made of silicon dioxide and thereby form each element isolation layer 9 in the element isolation area 12.

Thereafter, the silicon nitride film 5 and the pad oxide film 6 are removed by a wet method using thermal phosphoric acid and hydrofluoric acid. In this case, the pad oxide film 6 functions even as a protective film at the removal of the silicon nitride film 5 due to the thermal phosphoric acid.

Thus, a transistor forming area 11 surrounded by the element isolation layers 9 is formed in the SOI layer 4 of the SOI substrate 1. A semiconductor element is formed in the transistor forming area 11.

Incidentally, while the silicon nitride film 5 is formed on the SOI layer 4 through the pad oxide film 6 interposed therebetween in the present embodiment, the pad oxide film 6 may be provided when there is a need to relax stress produced due to the difference between the lattice constants of the crystal structures of the silicon nitride film 5 and the SOI layer 4 corresponding to the monocrystalline silicon and protect the SOI layer 4 at the removal of the silicon nitride film 5, for example. When unnecessary, the silicon nitride film 5 may directly be formed on the SOI layer 4.

In the present embodiment as described above, the pad oxide film and the silicon nitride film are formed and laminated over the SOI layer. Thereafter, the silicon nitride film is etched under the first condition with the silicon nitride film being left behind. Afterward, the remaining silicon nitride film and the pad oxide film are etched under the condition in the second etching step high in silicon selection ratio. Thus, the amount of chipping or cutting of the silicon layer (SOI layer) at the etching can be suppressed to the minimum. The silicon layer necessary for the subsequent dry oxidation can be allowed to remain. Even in the case of a relatively thin SOI layer, the element isolation layer can stably be formed by the LOCOS method.

The silicon nitride film is quickly etched in the first etching step relatively high in its etching rate. Thereafter, the amount of etching of silicon is suppressed in the second etching step, and the removal portion is formed in two stages. Consequently, the time necessary for the step for forming the removal portion can be shortened as compared with the case in which the formation of all removal portions is performed in the second etching step.

Further, the silicon nitride allowed to remain in the first etching step is set to range from over 10% to under 30% of the thickness of the silicon nitride film formed in the previous step. Thus, the first and second etching steps can be stabilized. Even in the case of a relatively thin SOI layer, each element isolation layer can stably be formed by the LOCOS method.

Incidentally, although each of the illustrated embodiments has explained the case in which the present invention is applied to the relatively thin SOI layer, the SOI layer allowed to remain can stably be formed even if the present invention is applied to a relatively thick SOI layer, and advantageous effects similar to each of the embodiments can be obtained.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor element comprised of an SOI structure including an SOI layer, comprising the steps of:
    preparing the SOI layer having a transistor forming area and an element isolation area on a surface thereof;
    forming an oxidation-resistant mask layer on the surface of the SOI layer;
    forming a resist mask in an area corresponding to the transistor forming area on the oxidation-resistant mask layer;
    a first etching step for etching the oxidation-resistant mask layer using the resist mask in such a manner that the oxidation-resistant mask layer remains by a predetermined thickness;
    a second etching step for etching the oxidation-resistant mask layer allowed to remain by the predetermined thickness in accordance with the first etching step, using the resist mask and exposing the SOI layer of a portion corresponding to the element isolation area; and
    oxidizing the exposed SOI layer by a LOCOS method using the oxidation-resistant mask layer allowed to remain in accordance with the second etching step to thereby form an element isolation layer,
    wherein an etching rate of the oxidation-resistant mask layer in the first etching step is higher than that of the oxidation-resistant mask layer in the second etching step, and
    wherein a silicon-to-etching selection ratio in the second etching step is higher than a silicon-to-etching selection ratio in the first etching step.

2. The method according to claim 1, wherein the predetermined thickness ranges from over 10% to under 30% of the thickness of the oxidation-resistant mask layer.

3. The method according to claim 1, wherein the predetermined thickness is set to 10% of the thickness of the oxidation-resistant mask layer.

4. The method according to any of claims 1, wherein the etching in the first etching step is anisotropic etching.

5. The method according to any of claims 1, wherein the etching in the second etching step is anisotropic etching.

6. A method for manufacturing a semiconductor element comprised of an SOI structure including an SOI layer, comprising the steps of:
    preparing the SOI layer having a transistor forming area and an element isolation area on a surface thereof;
    forming a pad oxide film on the surface of the SOI layer and forming an oxidation-resistant mask layer on the pad oxide film;
    forming a resist mask in an area corresponding to the transistor forming area on the oxidation-resistant mask layer;
    a first etching step for etching the oxidation-resistant mask layer using the resist mask in such a manner that the oxidation-resistant mask layer remains by a predetermined thickness;
    a second etching step for etching the oxidation-resistant mask layer allowed to remain by the predetermined thickness in accordance with the first etching step and the pad oxide film, using the resist mask and exposing the SOI layer of a portion corresponding to the element isolation area; and oxidizing the exposed SOI layer by a LOCOS method using the oxidation-resistant mask layer allowed to remain in accordance with the second etching step to thereby form an element isolation layer, wherein an etching rate of the oxidation-resistant mask layer in the first etching step is higher than that of the oxidation-resistant mask layer in the second etching step, and wherein a silicon-to-etching selection ratio in the second etching step is higher than a silicon-to-etching selection ratio in the first etching step.

7. The method according to claim 6, wherein the predetermined thickness ranges from over 10% to under 30% of the thickness of the oxidation-resistant mask layer.

8. The method according to claim 6, wherein the predetermined thickness is set to 10% of the thickness of the oxidation-resistant mask layer.

9. The method according to any of claims 6, wherein the etching in the first etching step is anisotropic etching.

10. The method according to any of claims 6, wherein the etching in the second etching step is anisotropic etching.

* * * * *